United States Patent [19]

Takamoto

[11] Patent Number: 5,335,207
[45] Date of Patent: Aug. 2, 1994

[54] SEMICONDUCTOR INTEGRATED CIRCUIT DEVICE

[75] Inventor: Hiroshi Takamoto, Tokyo, Japan

[73] Assignee: Kabushiki Kaisha Toshiba, Kawasaki, Japan

[21] Appl. No.: 729,561

[22] Filed: Jul. 15, 1991

[30] Foreign Application Priority Data

Jul. 17, 1990 [JP] Japan .................. 2-188450

[51] Int. Cl.$^5$ .................. G11C 7/00; H01L 27/00
[52] U.S. Cl. .................. 365/233.5; 307/303.1
[58] Field of Search .................. 365/233.5; 307/303.1

[56] References Cited

U.S. PATENT DOCUMENTS

| | | | |
|---|---|---|---|
| 4,630,239 | 12/1986 | Reed et al. | 365/233.5 |
| 4,969,125 | 11/1990 | Ciraula et al. | 365/233.5 |
| 5,047,984 | 9/1991 | Monden | 365/233.5 |
| 5,062,082 | 10/1991 | Choi | 365/233.5 |

Primary Examiner—John Zazworsky
Attorney, Agent, or Firm—Foley & Lardner

[57] ABSTRACT

A semiconductor IC device includes a memory cell group; a pair of bit lines connected to the cell group; plural equalization transistors $T_R$ connected between the bit lines; address transition detectors ATD for detecting changes in address bits; and plural equalizing pulse generating circuits composed of plural logical gates, 15 to 22, respectively and provided for each equalization transistor to generate an equalizing pulse signal to each equalization transistor so that the levels of the two bit lines can be equalized with each other. Since signals outputted from the address transition detectors are synthesized, in particular at a node to which the equalizing pulse signal is applied, the number of logical gate stages to synthesize the detector output signals can be reduced and the wire lengths (e.g. wire capacitances) of the logical gates can be well balanced, thus improving the equalizing speed of the IC device.

4 Claims, 5 Drawing Sheets

FIG. 4A  ADDRESS INPUT

FIG. 4B  OUTPUT PULSES OF ADDRESS TRANSITION DETECTOR OR CONTROL CIRCUIT (eg. NODES 101 TO 104)

FIG. 4C  EQUALIZING PULSE (eg. NODE 116)

FIG. 4D  BIT LINE b  BIT LINE $\bar{b}$ (NOT EQUALIZED)

FIG. 4E  BIT LINE b  BIT LINE $\bar{b}$ (EQUALIZED)

SEMICONDUCTOR INTEGRATED CIRCUIT DEVICE

BACKGROUND OF THE INVENTION

The present invention relates to a semiconductor integrated circuit device provided with equalizing pulse generating circuits.

In prior-art semiconductor integrated circuit devices (referred to as IC, hereinafter), that is, in static LSI memory devices in particular, an equalizing pulse generating circuit is provided for increasing data read speed from memory cells. The above-mentioned equalization is effected as follows: an equalization transistor is provided between a pair of bit lines b; address transition detectors are provided to detect a change in address; a plurality of the address transition detection signals are synthesized by an equalizing pulse generating circuit composed of logical circuits to generate an equalizing signal which can turn on the equalization transistor to equalize the voltage levels of the two bit lines.

In designing the equalizing pulse generating circuit for equalizing the bit lines in level as described above, the following points must be taken into account:

(1) The logical circuits constituting the equalizing pulse generating circuit must be combined efficiently so that the level of the bit lines is equalized on the basis of pulse signals generated by the address transition detectors and a control circuit. In addition, the number of stages of the logical circuits must be minimized;

(2) The optimum dimensions must be determined for the respective logical circuits under due consideration of the wire capacitance, the gate capacitance of the succeeding stage, etc.; and (3) The pattern of the logical circuits formed on a chip must be optimized so that the lengths of wires from the address transition detectors and the control circuit to the logical circuits can be minimized.

With the advance of the larger capacity and higher speed static memory devices, recently, the following problems arise in designing the above-mentioned equalizing pulse generating circuit.

(a) The equalizing pulse signals are generated from the equalizing pulse generating circuit composed of combined logical circuits, on the basis of change in address detected by all the address transition detectors. Therefore, there exists such a tendency that the scale of the equalizing pulse generating circuit increases with an increasing number of address inputs and the advance of the memory capacities, with the result that it has become difficult to further reduce the number of stages of the logical circuits for improvement of the data read speed to the memory cells.

(b) Within the chip, the number and the length of wires between the address transition detectors, the control circuit and the logical circuits inevitably increase with increasing memory capacity, as compared with those of the conventional memory device. Accordingly, since the respective output load capacitances of the respective logical circuits increase with increasing wire capacitances, the dimensions of the respective logical circuits or the inverter circuits in particular, increase. In the case where the dimensions increase, since the output load capacitance of the preceding stage logical circuit tends to drive the inverter circuit of increased dimensions, it is also necessary to increase the preceding stage circuit dimensions, thus resulting in a vicious circle. To avert this vicious circle, a method of driving the logical circuits by large dimensional circuits or the method of increasing the number of logical gates is required, thus reducing the data read speed to the memory cells.

(c) With respect to the peripheral circuits, there exists a tendency that the number of stages of the logical circuits from address inputs to word lines WL connected to the memory cells decreases due to miniaturization of the device or formation of the circuits into BiCMOS devices. In contrast with this, since the number of logical stages of the equalizing pulse circuit for generating an equalizing pulse signal does not change or tends to be increased for the reason as described in items (a) and (b) above, there exists a problem in that only the speed of equalization is not increased.

The above-mentioned problem will be explained in more detail with reference to FIG. 5, which shows an arrangement on a prior-art semiconductor IC device chip. In FIG. 5, address transition detectors $ATD_i$ (i=1, ... 7) and a control circuit CC are arranged on predetermined positions on the chip in such a way that the detectors $ATD_4 ... ATD_7$ are formed on the left side of the memory cell section; the detectors $ATD_2$ and $ATD_3$ are formed on the upper side of the memory cell section; and the detector $ATD_1$ and the control circuit CC are formed on the right side of the memory cell section. Further, logical circuits 50 ... 60 which constitute an equalizing pulse generating circuit are arranged at appropriate positions under due consideration of the afore-mentioned items (1), (2) and (3). Input nodes 301, ... 308 of NAND gates 50, ... 53 are roughly equal to each other in wire length and therefore there exists no specific problem. However, only an input node 311 to a NOR gate 55 is longer in wire length than other input nodes 309, 310, and 312 to NOR gates 54 and 55. Further, an input node 314 to a NAND gate 56 is much longer in wire length than an input node 313 to the same NAND gate 56, thus resulting in an unbalanced wire layout.

When a pair of nodes to be compared is in unbalanced condition; that is, when one of the node wire lengths is longer than the other node wire lengths, the capacitance of the long node wire is larger than that of the short node wire. For instance, the wire capacitance of the node 311 is large, and the wire capacitances of the nodes 309, 310, and 312 are roughly equal to each other and small in comparison with that of the node 311. Therefore, even if the circuit dimensions of the NAND gates 50, ... 53 are all the same, since only the NAND gate 52 whose output terminal is connected to the node 311 has a large wire capacitance as compared with those of the other NAND gates 50, 51 and 53, a problem arises in that the operation speed of the equalizing pulse generating circuit composed of the logical circuits is inevitably reduced.

SUMMARY OF THE INVENTION

With these problems in mind therefore, it is the primary object of the present invention to provide a semiconductor integrated circuit device which can decrease the number of logical circuit stages of the equalizing pulse generating circuit to increase the equalization speed.

To achieve the above-mentioned object, the present invention provides a semiconductor integrated circuit device, comprising: a memory cell group; a pair of bit lines connected to the memory cell group; a plurality of equalizing means provided between a pair of the bit lines; address transition detecting means for detecting changes in address bits and outputting detection pulse signals corresponding thereto; and equalizing pulse generating means composed of a plurality of logical circuits and provided for each of the plural equalizing means, for generating an equalizing pulse signal to the equalizing means.

In the semiconductor integrated circuit device according to the present invention, since a plurality of equalization transistors are provided for bit lines and further detection pulse signals indicative of changes in address bits outputted from the address transition detectors are synthesized by a plurality of sets of logical circuits corresponding to the equalization transistors, respectively so that the detection pulse signals can be partially synthesized at the nodes to which the equalizing pulses are applied, respectively. It is possible to decrease the number of stages of the logical circuits and thereby to increase the operation speed of the equalization.

DESCRIPTION OF THE PREFERRED EMBODIMENTS

Figure 1:
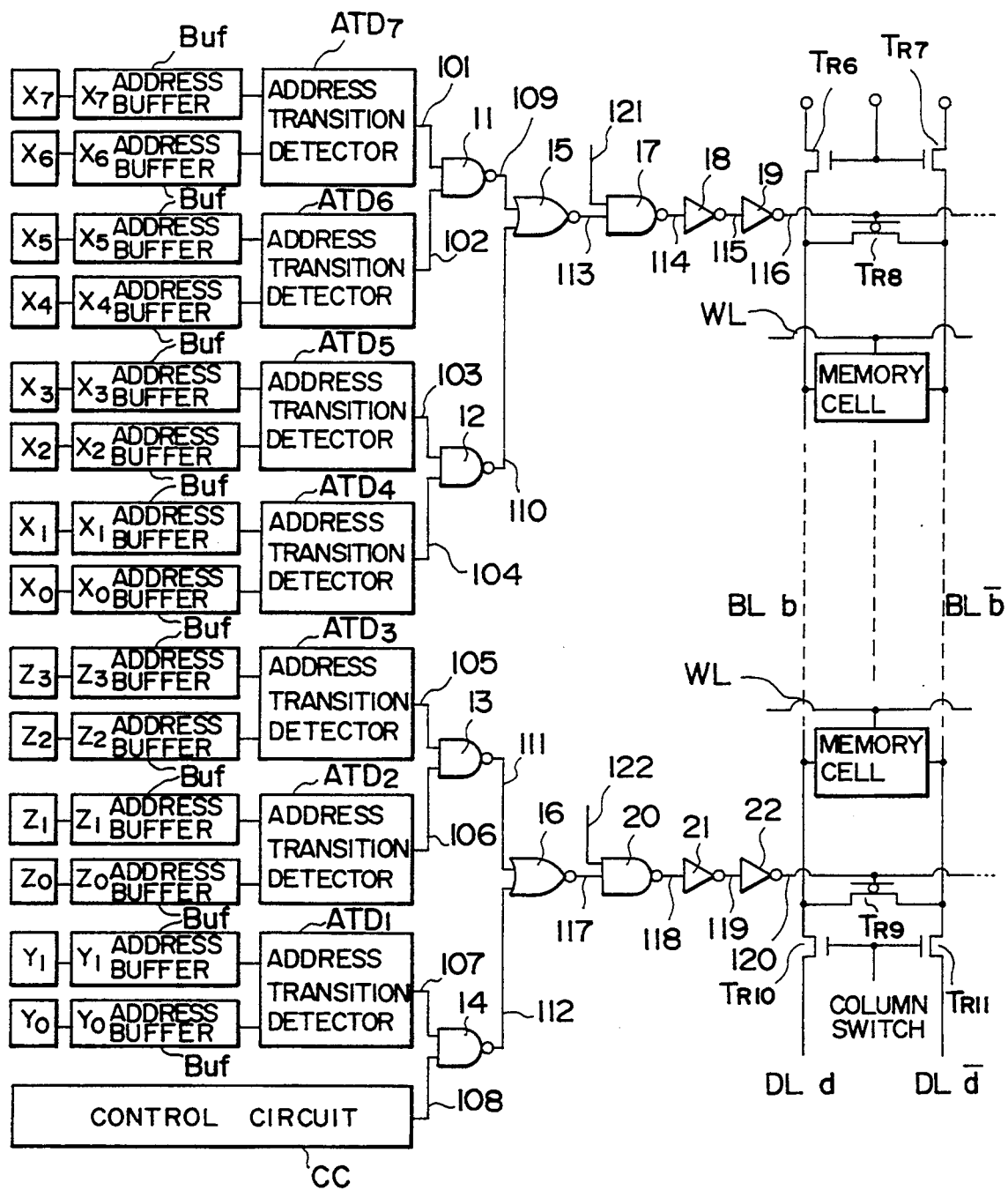
FIG. 1 is a circuit diagram showing an embodiment of the semiconductor integrated circuit device according to the present invention.
Figure 2:
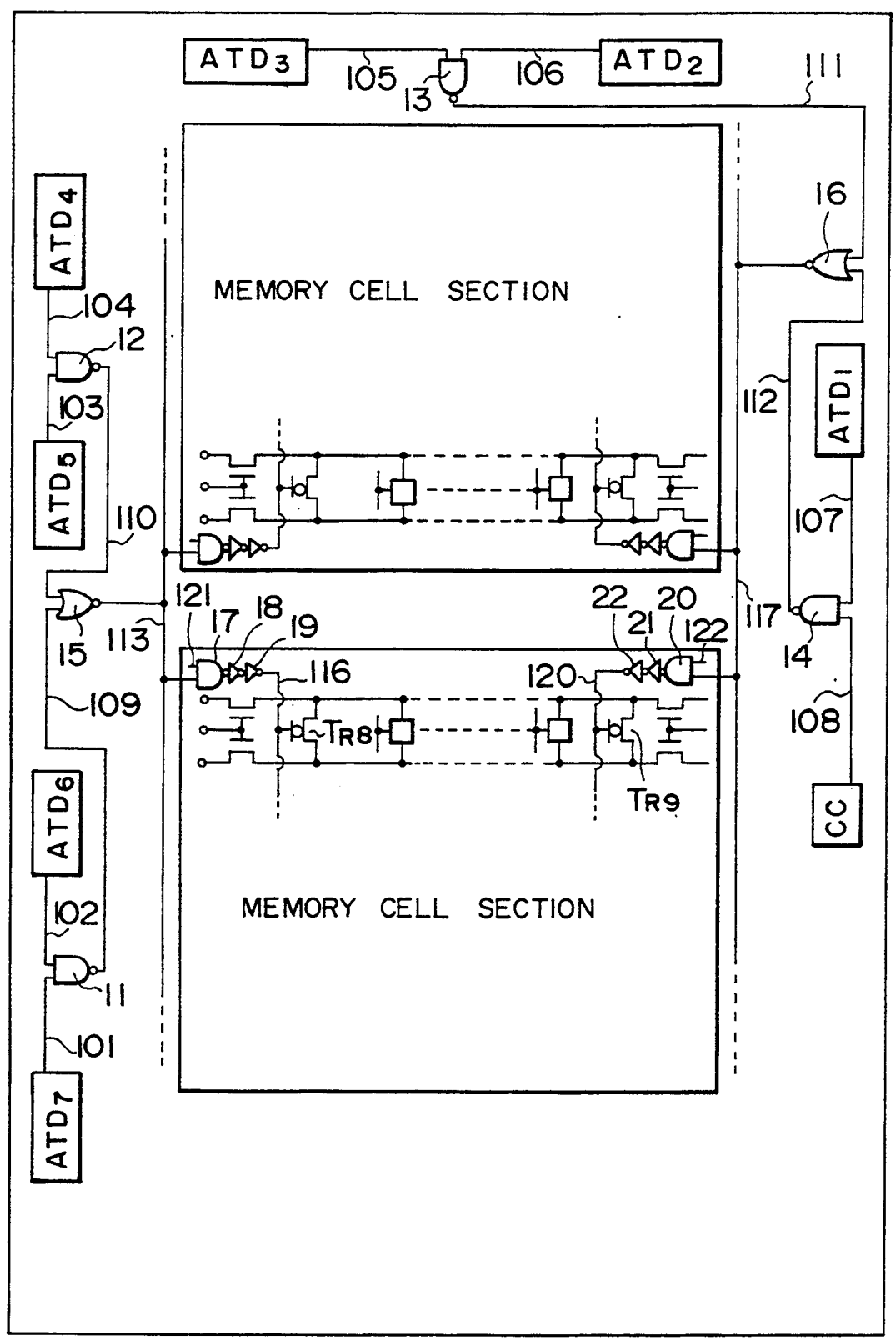
FIG. 2 is an arrangement drawing showing a layout on a chip of the embodiment shown in FIG. 1.
Figure 4:
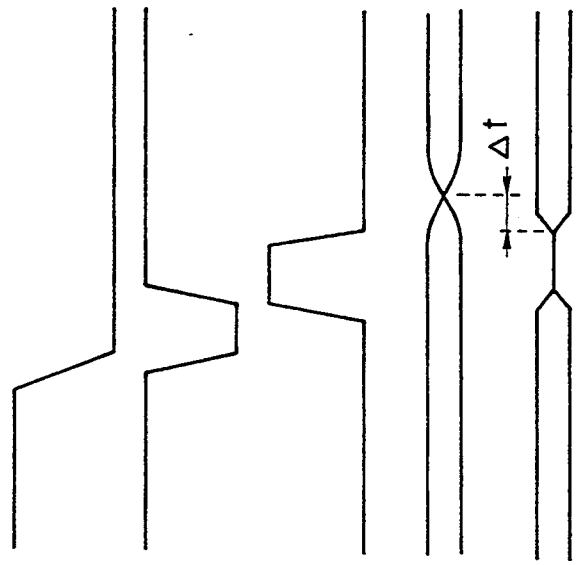
FIGS. 4A–4E are timing charts for explaining the equalization operation of bit lines.

An embodiment of the semiconductor integrated circuit (IC) device according to the present invention will be described hereinbelow with reference to FIGS. 1 and 2. FIG. 1 is a circuit diagram showing equalizing pulse generating circuits incorporated in the semiconductor IC device according to the present invention, and FIG. 2 is an arrangement of the layout of the equalizing pulse generating circuits shown in FIG. 1. In FIG. 1, two n-channel intrinsic equalization transistors $T_{R8}$ and $T_{R9}$ are provided between two bit lines b and b. A plurality of address transition detectors $ATD_i$ (i=1, ... 7) detect changes of address inputs $Y_0, Y_1, Z_0, Z_1, ... Z_3, X_1, ... X_6, X_7$. An equalizing pulse generating circuit synthesizes these detection signals to generate an equalizing pulse signal. In response to the equalizing pulse signal, the equalization transistor $T_{R8}$ or $T_{R9}$ is turned on to equalize the level of the bit lines b and b, as shown in FIG. 4E.

In more detail, the transistor $T_{R8}$ is provided on one side of a memory cell group, and the transistor $T_{R9}$ is provided on the other side of the memory cell group.

All the changes in level of address inputs (i.e. row address inputs represented by $X_0$ to $X_7$, section address inputs represented by $Z_0$ to $Z_3$, and column address inputs represented by $Y_0$ to $Y_1$) are detected by the address transition detectors (referred to as detectors $ATD_i$ (i=1, ... 7). The detection pulse signals (i.e. the output signals) of the detectors $ATD_4 ... ATD_7$ are synthesized by the equalizing pulse generating circuit composed of logical gates 11, 12, 15, 17, 18 and 19. On the other hand, the detection pulse signals (i.e. the output signals) of the detectors $ATD_1 ... ATD_3$ and output pulse signal of a control circuit CC are synthesized by the equalizing pulse generating circuit composed of logical gates 13, 14, 16, 20, 21 and 22. That is, the NAND gate 11 is activated on the basis of the detection signals of the detectors $ATD_6$ and $ATD_7$, and the NAND gate 12 is activated on the basis of the detection signals of the detectors $ATD_4$ and $ATD_5$. Further, the NOR gate 15 is activated on the basis of the outputs of the two NAND gates 11 and 12, and the NAND gate 17 is activated on the basis of the output of the NOR gate 15 and a decode signal inputted via a node 121 to designate a section of memory cell area. The output of this NAND gate 17 is given to a gate of the equalization transistor $T_{R8}$ via the two NOT circuits 18 and 19, as an equalizing pulse signal to equalize both the levels of the two bit lines b and b, as shown in FIG. 4C. Further, in the case where no level equalization is made, the level width required to inverse each data level at the two bit lines b and b is large (i.e. doubled) as compared with when each data level is inversed from the constant equalization level as shown in FIG. 4E, so that it takes much time (i.e. 2 Δt) to inverse each data level as shown in FIG. 4D.

On the other hand, the NAND gate 13 is activated on the basis of the outputs of the detectors $ATD_2$ and $ATD_3$, and the NAND gate 14 is activated on the basis of the outputs of the detector $ATD_1$ and the control circuit CC. Further, the NOR gate 16 is activated on the basis of the outputs of the NAND gates 13 and 14, and the NAND gate 20 is activated on the basis of the output of the NOR gate 16 and a decode signal inputted via a node 122 to designate a section of memory cell area. The output of this NAND gate 20 is given to a gate of the equalization transistor $T_{R9}$ via the two NOT circuits 21 and 22 as an equalizing pulse signal to equalize both the levels of the two bit lines b and b.

When the equalization transistor $T_{R8}$ or $T_{R9}$ is turned on in response to the equalizing pulse signal, the levels of the two bit lines b and b indicative of data levels previously stored in a memory cell before selection are both equalized to each other. Under these conditions, when the change in level of the address inputs has been completed, since the equalizing pulse signal is turned off, the equalization transistor $T_{R8}$ or $T_{R9}$ is turned off to complete the level equalization of the two bit lines b and b, so that a data stored in a selected memory cell is outputted to the bit lines b and b.

In the present invention, as described above, it is possible to equalize both the bit lines b and b in level by turning on either one of the two equalization transistors $T_{R8}$ and $T_{R9}$. In other words, since there are two synthesizing logical circuits for equalization and further the final stage logical values are synthesized on a node whose level is to be equalized, it is possible to reduce the number of stages of logical circuits.

Figure 5:
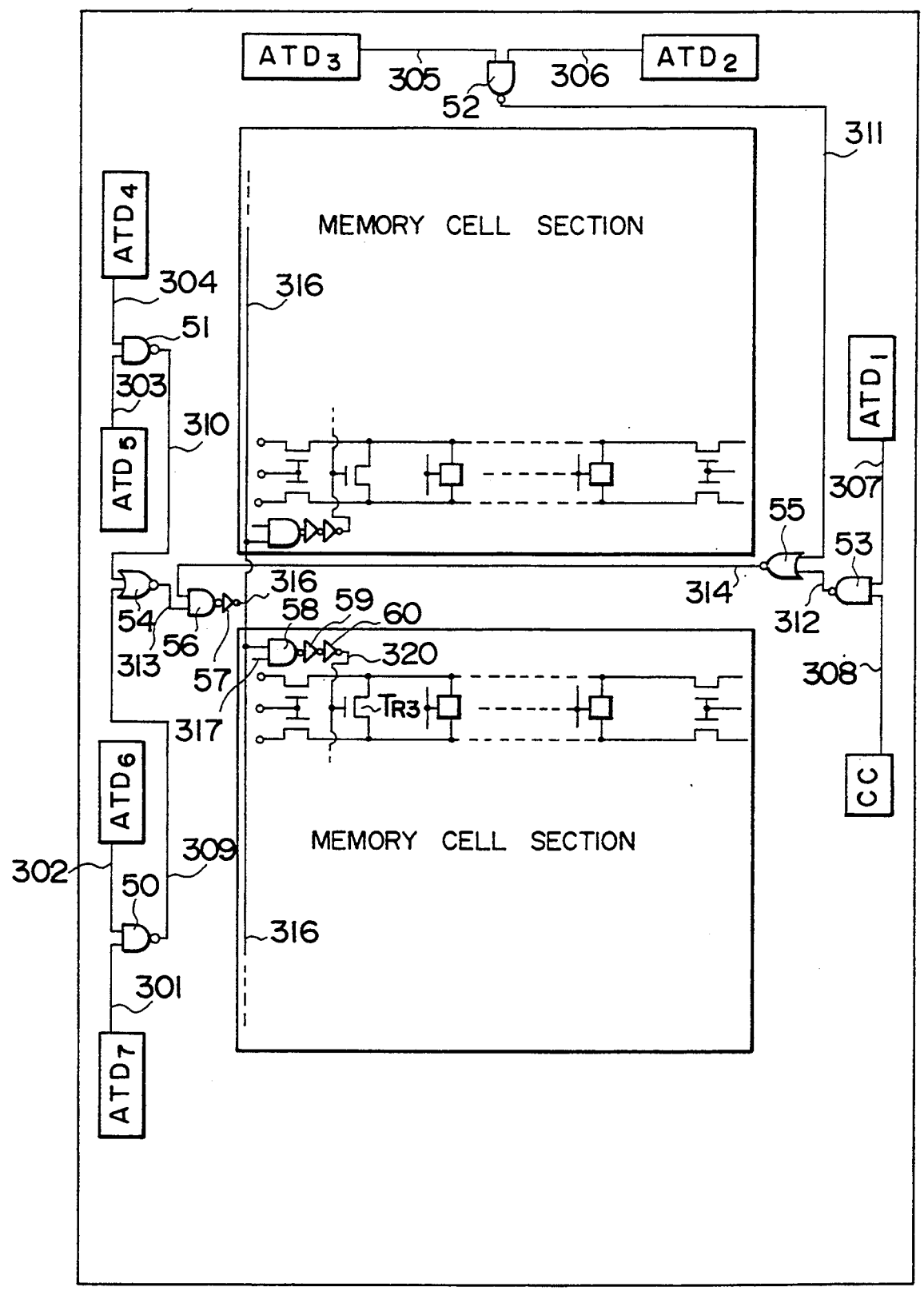
FIG. 5 is an arrangement drawing showing a layout on a chip of a prior-art semiconductor integrated circuit device.

FIG. 2 shows a layout on a chip of the semiconductor IC device shown in FIG. 1. In prior-art devices as shown in FIG. 5, the wire lengths of the nodes 313 and 314 are not well balanced with each other. In the case of FIG. 2, however, the wire lengths of the nodes 113 and 117 (which correspond to the nodes 313 and 314 in FIG. 5) are well balanced with each other, because the synthesizing logical circuits for equalization are laid out in a well balanced state.

Figure 3:
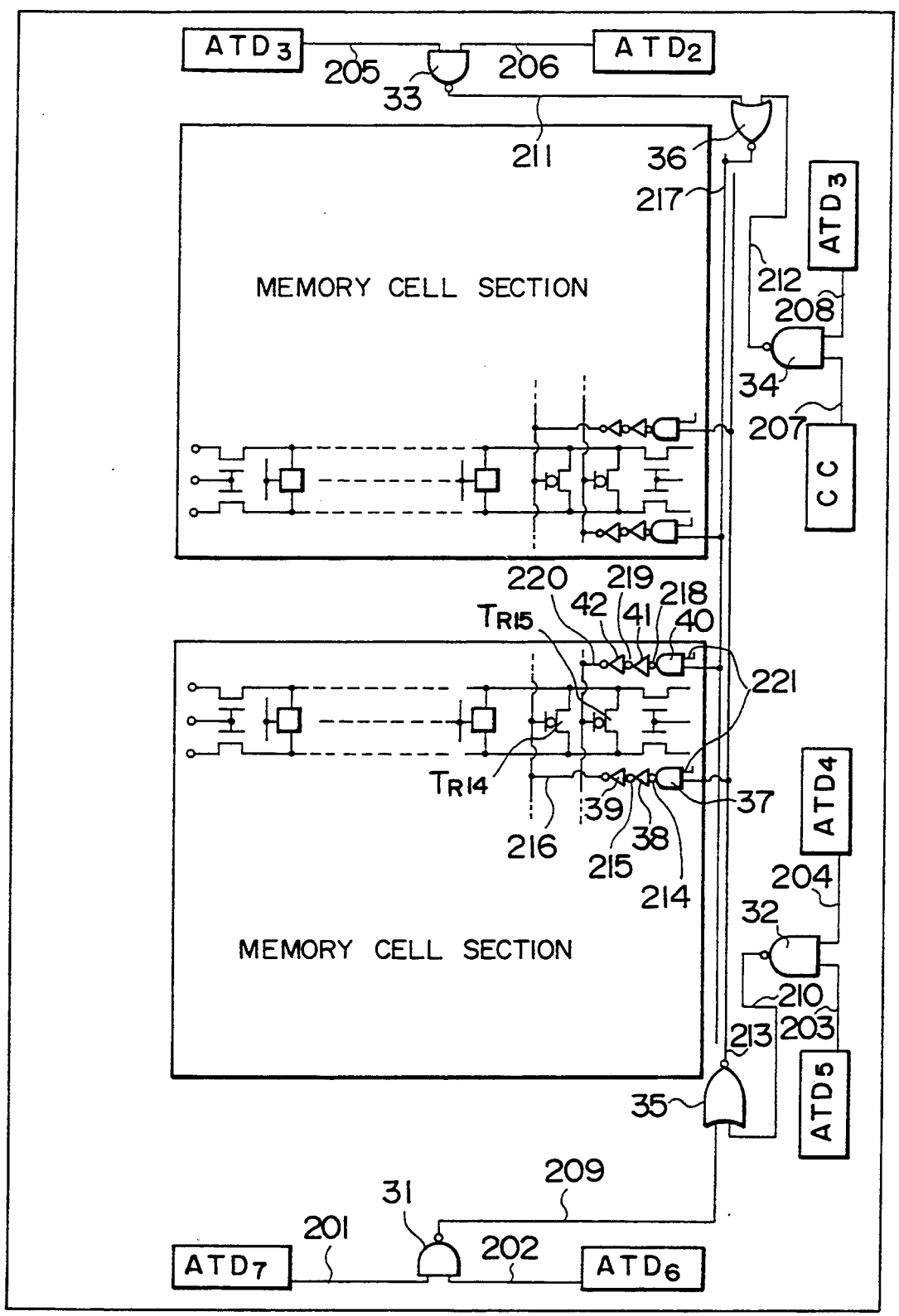
FIG. 3 is an arrangement drawing showing a layout on a chip of a modification of the embodiment shown in FIG. 1.

FIG. 3 shows a modification of the embodiment shown in FIG. 2. In FIG. 2, the two equalization transistors $T_{R8}$ and $T_{R9}$ are arranged on both the sides of the memory cell group. Being different from the layout shown in FIG. 2, in FIG. 3 two equalization transistors $T_{R14}$ and $T_{R15}$ are both arranged on one side of the memory cell group and further the two synthesizing logical circuits for equalization are arranged in the vicinity of the two equalizing transistors $T_{R14}$ and $T_{R15}$ for the convenience of layout on the device chip.

In the above embodiment, n-channel intrinsic equalization transistors are formed. Without being limited thereto, it is of course possible to use P-channel transistors. Further, the equalization in level between the two bit lines b and $\bar{b}$ has been explained. However, the present invention can be applied to equalize data level on I/O lines, S/A lines, etc.

As described above, in the present invention, since detection pulse signals indicative of changes in bits of an address and outputted by the address transition detectors are synthesized at the node to which the equalizing pulse is applied, it is possible to reduce the number of stages of the logical circuits for synthesizing the detection pulse signals, and to realize a reasonable layout of the logical circuits on the chip for providing well balanced conditions of wire capacitance, thus improving the operating speed of data level equalization between two lines.

What is claimed is:

1. A semiconductor integrated circuit device comprising:
    a group of a plurality of memory cells, the plurality of memory cells in the group being arranged to form a column;
    a pair of bit lines commonly connected to said plurality of memory cells;
    a plurality of equalizing means provided across said pair of said bit lines, said plurality of equalizing means being provided at different positions along said bit lines;
    a plurality of address transition detecting means for detecting changes in address bits and outputting detection pulse signals corresponding thereto; and
    a plurality of equalizing pulse generating means composed of a plurality of logical circuit stages and provided for each of said plural equalizing means, for generating an equalizing pulse signal from said detection pulse signals outputted by said address transition detecting means and providing said equalizing pulse signal to said equalizing means.

2. The semiconductor integrated circuit device of claim 1, wherein one each of said plurality of equalizing means are disposed, respectively, at one end and the other end of said pair of bit lines.

3. The semiconductor integrated circuit device of claim 1, wherein one of said plurality of equalizing means is disposed near one end of said pair of bit lines.

4. The semiconductor integrated circuit device of claim 2, wherein one-half of said plurality of address transition detecting means are connected to one equalizing pulse generating means disposed close thereto and other half of said plurality of address transition detecting means are connected to another equalizing pulse generating means disposed close thereto.

* * * * *